(12) United States Patent
Groeger

(10) Patent No.: US 6,175,730 B1
(45) Date of Patent: Jan. 16, 2001

(54) RADIO RECEIVER WITH A POTENTIOMETER AS VOLUME CONTROL

(75) Inventor: Klaus-Erwin Groeger, Diekholzen (DE)

(73) Assignee: Robert Bosch GmbH, Stuttgart (DE)

( * ) Notice: Under 35 U.S.C. 154(b), the term of this patent shall be extended for 0 days.

(21) Appl. No.: 08/888,710

(22) PCT Filed: Oct. 25, 1996

(86) PCT No.: PCT/DE96/02036

§ 371 Date: Jul. 7, 1997

§ 102(e) Date: Jul. 7, 1997

(87) PCT Pub. No.: WO97/20386

PCT Pub. Date: Jun. 5, 1997

(30) Foreign Application Priority Data

Nov. 30, 1995 (DE) ............................................. 195 44 657

(51) Int. Cl.[7] ..................................................... H04Q 7/32
(52) U.S. Cl. ................... 455/355; 455/200.1; 455/403; 455/144; 455/341; 330/251; 330/252
(58) Field of Search ................................. 455/355, 200.1, 455/297, 345, 403, 572, 571, 573, 144, 191.3, 194.2, 195.1, 293, 340, 341, 412, 20, 22, 23, 233.1; 330/251, 252

(56) References Cited

U.S. PATENT DOCUMENTS

| 4,292,467 | * | 9/1981 | Odien et al. ........................... 455/177 |
| 4,441,086 | * | 4/1984 | Karlow et al. ........................ 455/355 |
| 4,706,294 | * | 11/1987 | Ouchida et al. ..................... 455/355 |
| 5,073,943 | * | 12/1991 | Chapman ............................. 455/177 |
| 5,394,476 | * | 2/1995 | Tollins et al. ......................... 455/177 |
| 5,872,852 | * | 2/1999 | Dougherty ............................ 455/345 |

FOREIGN PATENT DOCUMENTS 59-230311 * 12/1984 (JP).
63-048905 * 7/1988 (JP).

OTHER PUBLICATIONS

Patent Abstract of Japan vol. 009, No. 106 (E–313), May 10, 1985 & JP 59 230311 A.
Patent Abstract of Japan vol. 012, No. 265 (E–637), Jul. 23, 1988 & JP 63 048905 A.

* cited by examiner

Primary Examiner—Wellington Chin
Assistant Examiner—Keith Ferguson
(74) Attorney, Agent, or Firm—Michael J. Striker

(57) ABSTRACT

A radio receiver with a potentiometer as the volume control is described, wherein an unintentional displacement of the potentiometer during the switched-off phase becomes effective only with a delay when the radio receiver is switched on by means of a switch which is separate from the potentiometer.

6 Claims, 1 Drawing Sheet

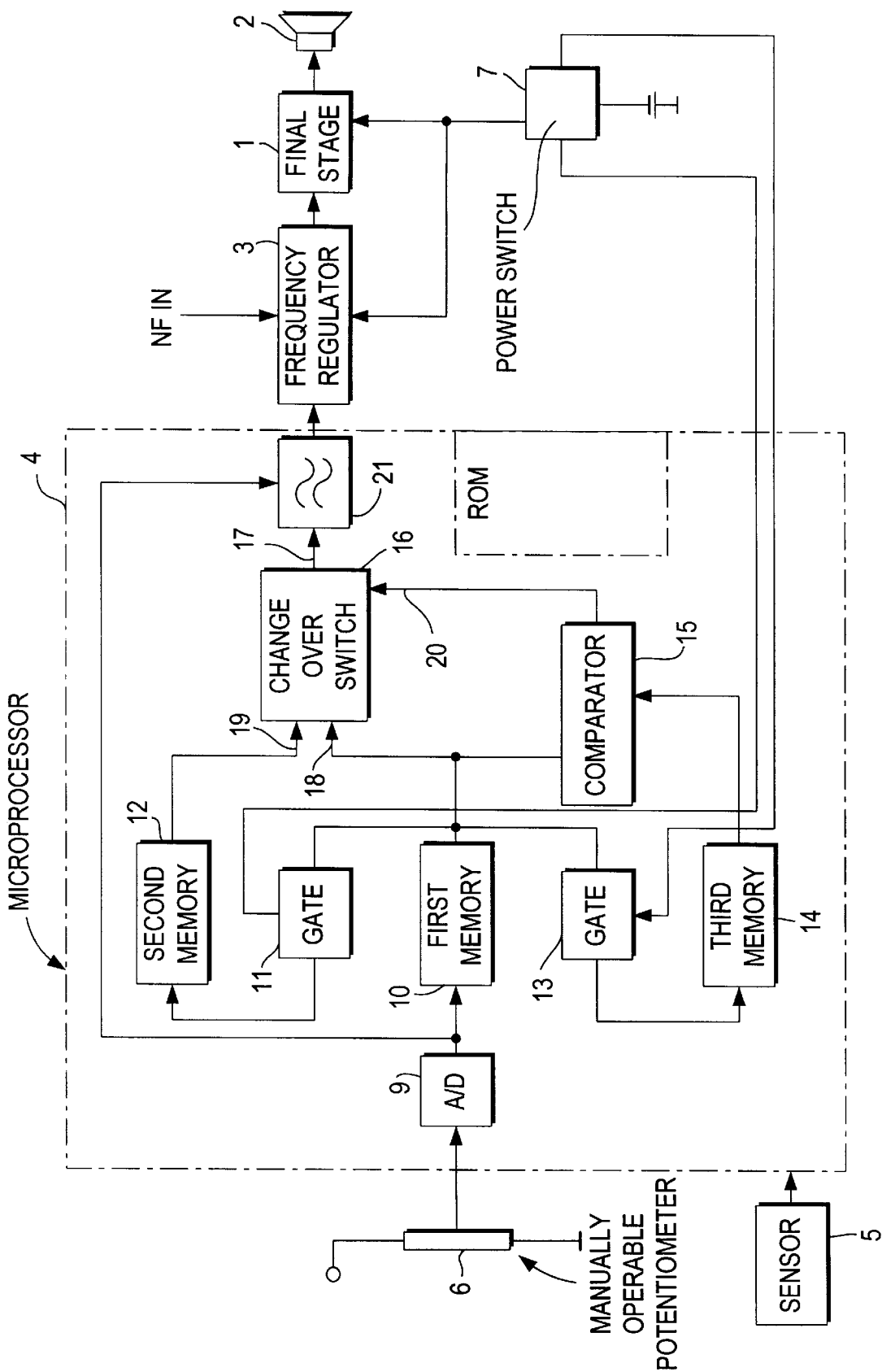

RADIO RECEIVER WITH A POTENTIOMETER AS VOLUME CONTROL

BACKGROUND OF THE INVENTION

1. Field of the Invention

The present invention relates to a radio receiver and, more particularly, to a radio receiver with a potentiometer as volume control.

2. Prior Art

Radio receivers with a potentiometer as volume control have been known for a long time. Customarily the actuation of a switch in the current supply is coupled with the volume control in such a way that by displacing the knob of the potentiometer to the left or lower stop the volume is reduced and thereafter the switch for the current supply is actuated.

However, radio receivers have been on the market for a long time, wherein the switch in the current supply and the volume control must be operated separately from each other. Furthermore, characteristically in motor vehicles the installed car radios are connected via a series connection of two switches to the current supply, namely the series connection of a switch in the ignition lock of the vehicle and of a switch on the instrument.

When turning the radio receiver off with a switch separate from the volume control, it is possible to unintentionally turn the volume control in the turned-off state to full volume, without this being noticed at first. When a radio receiver set in this manner is switched on, the reproduction of the received transmitter takes place at an undesired volume.

In connection with road traffic radio receivers it is known per se to raise the volume of a traffic report automatically to a preset volume if it had been switched to a low volume or even switched off by means of the potentiometer of the radio receiver.

The automatic tracking of the volume in accordance with the respective loudness of the driving noise in the interior of a motor vehicle has been a property of modern car radios for a long time.

Such radio receivers have microprocessors which receive digital control signals and digitally control an audio frequency regulator in the low frequency state.

SUMMARY OF THE INVENTION

It is an object of the present invention to provide an improved radio receiver with a potentiometer for volume control of the above-described kind, that does not suffer from the above-described disadvantages.

This object and others which will be made more apparent hereinafter are attained in a radio receiver having a final amplifier stage controlling volume, power supply means for supplying current to the final amplifier stage and other components, as needed, a manually adjustable potentiometer for control of the final amplifier stage to adjust the volume, at least one switch for switching the current supplied to the final amplifier stage on and off, the manually adjustable potentiometer being operable completely independently of the at least one switch.

According to the invention the radio receiver also includes means for controlling the final amplifier stage so that the volume is maintained at a predetermined level when the at least one switch is actuated to switch on the current to the final amplifier stage until subsequent adjustment of the manually operable potentiometer, the predetermined volume level corresponding to that volume level existing when the at least one switch was previously actuated to switch off the current to the final amplifier stage before the at least one switch was actuated to again switch on the current to the final amplifier stage, this predetermined volume level being any volume value in a volume range obtainable by setting the manually operable potentiometer independently of the at least one switch, and means for adjusting the volume after the at least one switch is activated to turn on the current to the final amplifier stage only after the manually adjustable potentiometer is first adjusted manually after the at least one switch is actuated to switch on the current to the final amplifier stage.

By means of a radio receiver according to the invention of the effect of an unintentional displacement of the potentiometer is prevented in the turned-off state of the radio receiver. Until the listener again operates the potentiometer, i.e. until his hand is again on the knob of the potentiometer, and up to that time change in volume are prevented. Features of preferred embodiments are disclosed in the appended dependent claims and in the detailed description hereinbelow.

BRIEF DESCRIPTION OF THE DRAWINGS

The objects, features and advantages of the invention will now be illustrated in more detail with the aid of the following description of the preferred embodiments, with reference to the accompanying figures in which:

The sole FIGURE is a block diagram of a microprocessor-controlled audio frequency stage of a radio receiver.

DESCRIPTION OF AN EXEMPLARY EMBODIMENT

The audio frequency stage 1 in FIG. 1 comprises a final amplifier 1 which supplies a speaker 2, in which the audio frequency modulation of the selected transmitter is made audible to the user of the radio receiver. The output signals of a digitally operating audio frequency regulator 3 are supplied to the audio frequency amplifier 1. A microprocessor 4 as the volume control stage has been connected to a control input of the audio frequency regulator 3. Only selected functional units of the microprocessor are represented in detail in the drawings.

In accordance with the object to be attained, the volume control stage comprises, besides the microprocessor 4 and besides sensors 5 for automatic volume control—of which a road traffic radio decoder represents an example—, a potentiometer 6 for the manual setting of the volume. A switch 7 for the current supply 8 can be operated separately from the potentiometer and is not coupled with it. The switch can be located in the ignition lock, for example, if the radio receiver is a car radio, and can be actuated by means of the ignition key. The switch 7 is also used for the current supply of the remaining (components of the audio frequency stage and of the other components, not further represented, of the radio receiver.

The knob of the potentiometer 6 is connected with an A/D converter 9 in an input of the microprocessor for the manual volume control. In the program flow of the microprocessor, the output of the A/D converter 9 is connected with a first memory 10, for example a RAM, which digitally stores the respective instantaneous set value of the potentiometer 6 as long as the current supply is switched on.

The input of a second memory 12 can be connected to the output of the memory 10 via a first gate circuit 11. This second memory is, for example, an E²PROM, since data remain stored in it during the entire switch-off phase of the radio receiver, as will be explained later.

The output of the memory 10 can be connected with the input of a third memory 14 via a second gate circuit 13. The third memory 14 can again be constituted by a RAM.

In the program flow, the output of this third memory 14 and the output of the first memory 10 are connected with the two inputs of a comparator stage 15, whose output controls the change-over switch 16 via a control inlet 20. The outlet 17 of the change-over switch 16 is connected via a low-pass filter 21 with the input of the audio frequency regulator 3 for the manual control of the volume of the radio receiver, and therefore also with the input of the final amplifier.

In the program flow, an input 18 of the change-over switch 16 can be connected with the output of the first memory 10, while the second input 19 of the change-over switch 16 can be connected to the output of the second memory 12.

In the program flow, a control input of the first gate circuit 11 receives a control signal from the switch 7 when the receiver is switched off. But a control input of the second gate circuit 13 receives a control signal from the switch 7 when the receiver is switched on.

The microprocessor program is designed in such a way that the comparator stage 15 keeps the output 17 of the change-over switch 16 connected with its second input 19 as long as the two input signals of the comparator stage 15 match, but that it connects the output 17 with the first input 18 when the signals at the inputs are different from each other.

The microprocessor program controls the audio frequency stage in the manner described below.

At the moment of switch-off, the potentiometer 6 is in the setting corresponding to the desired volume. This setting is digitally stored in the RAM memory 10. During the switch-off of the power supply 8, the first gate circuit 11 is opened for the length of a switch-on pulse derived from switch 7. In the process, the E²PROM memory 12 takes over the contents of the first memory 10. This second memory 12 keeps the set value of the potentiometer at switch-off stored during the subsequent current-less phase.

When the radio receiver is switched on again, a switch-on pulse derived from the switch 7 opens thus second gate circuit 13 for its length. In the process the third memory 14, which again can be a RAM memory, takes over the contents of the memory 10, which represents the setting of the potentiometer at the time of switch-off. This setting can easily be unintended and remains stored in the third memory 14 even if the setting of the potentiometer is later changed.

Following the switch-on pulse, the contents of the two memories 10 and 14 coincide. The input signals of the comparator stage 15 are identical, and the output of the change-over switch 16 is kept connected with the output of the second memory 12 via the second input 19.

However—as already mentioned—, the volume to which the potentiometer had been set during the switch-off of the radio receiver is stored in this memory 12. Therefore an unintentional displacement of the potentiometer 6 during the switched-off phase remains without any effect on the reproduction volume during switch-on.

This change-over switch setting remains until the listener makes a change of the setting of the knob of the potentiometer. At that time the contents of the first memory 10, in which the respectively instantaneous potentiometer setting is digitally stored, are changed in comparison with the third memory 14, which contains the switch-on setting of the potentiometer 6. This deviation indicates that the listener at that moment intends to cause the first change in volume following switch-on. The comparator stage 15 recognizes the appearance of the difference of the contents of the memories 10 and 14, and in the change-over switch 16 now connects its output 17 with its first input 18, which is connected with the output of the first memory 10. From now on the amplification of the final amplifier 1, i.e. the instantaneous potentiometer setting, is no longer determined by the contents of the second memory 12, but by the contents of the first memory 10.

Thereafter the contents of the third memory 14 can be erased.

Thus the described circuit delays the time the instantaneous potentiometer setting has an effect on the volume of the end amplifier 1 following switch-on until the hand of the listener displaces the potentiometer knob. Since at this time the listener is prepared to change the volume, he will interpret a volume increase beyond what he has imagined as the result of his own wrong manipulation of the potentiometer and will immediately change this. Such a volume which exceeds expectations is always possible if in the switch-off phase the potentiometer has been displaced toward the right stop.

Thus, during the switch-on phase the above described circuit delays the time at which an unintentional displacement of the potentiometer knob becomes effective, away from the time of switch-on of the audio frequency stage to a time at which the listener intends to change the perceived volume and can immediately react to an unexpected change.

In unfavorable circumstances, for example if the potentiometer was turned to the right stop, a sudden large increase of the volume is created in the audio frequency regulator 3 at the time when the potentiometer setting is changed for the first time after switch-on. Therefore a low-pass filter 21 is arranged downstream of the output 17 of the change-over switch 16 to prevent a sudden volume increase. This causes a slow rise of the volume to the instantaneous potentiometer setting.

In case of a microprocessor control this low-pass filter is represented by continuous signals changing the volume.

In the exemplary embodiment the microprocessor program is designed in such a way that the rapidity of the increase of the volume is a function of the instantaneous setting of the potentiometer, namely in such a way that in case of a large volume the rise of the volume takes place more slowly than in case of a turned-off volume.

I claim:

1. A radio receiver having a final amplifier stage (1) controlling volume;

power supply means (8) comprising means for supplying current to the final amplifier stage (1);

a manually adjustable potentiometer (6) for control of the final amplifier stage to adjust the volume;

at least one switch (7) for switching said current supplied to said final amplifier stage on and off, said manually adjustable potentiometer (6) being operable completely independently of said at least one switch (7); and means for controlling said final amplifier stage (1) so that said volume is maintained at a predetermined level when said at least one switch (7) is actuated to switch on said current to said final amplifier stage (1) until subsequent adjustment of said manually adjustable potentiometer (6), said predetermined level of said volume being equal to that volume level existing when said at least one switch (7) was actuated to switch off said current to said final amplifier stage (1) before said at least one switch (7) was actuated to again switch on said current to said final amplifier stage (1) after said current has been off, said predetermined level being maintain by disregarding any adjustment of said adjustable potentiometer, said predetermined level being any volume value of a volume range obtainable by setting said manually adjustable potentiometer (6) independently of said at least one switch (7); and means for adjusting said volume after said at least one switch (7) is activated to turn on said current to said final amplifier stage (1) only after said manually adjustable potentiometer (6) is first adjusted manually after said at least one switch (7) is actuated to switch on said current to said final amplifier stage (1).

2. The radio receiver as defined in claim 1, further comprising a digitally controllable audio frequency regulator (3) having a respective regulator input and regulator output, and wherein said means for controlling said final amplifier stage (1) so that said volume is maintained at a predetermined level when said at least one switch (7) is actuated, and wherein said means for controlling said final amplifier stage (1) so that said volume is maintained at a predetermined level when said at least one switch (7) is actuated to switch on said current to said final amplifier stage (1) and said means for adjusting said volume after said at least one switch (7) is activated to turn on said current to said final amplifier stage (1) comprise a microprocessor (4), said microprocessor including an A/D converter (9) connected to said manually adjustable potentiometer (6) and having an A/D output;

a first memory (10) connected with said A/D output of said A/D converter and having a respective first memory input and output;

a second memory (12) connectable to said first memory (10) to receive digital data input therefrom and having a respective second memory input and output;

a third memory (14) connectable to said first memory (10) to receive digital data therefrom and having a respective third memory input and output;

a change-over switch (16) having a control input (20), first change-over switch input (18), a second change-over switch input (19) and a change-over switch output (17), said first memory output being connected with said first change-over switch input (18) and said second memory output being connected with said second change-over switch input (19), said change-over switch output (17) being connected with said regulator input;

a comparator stage (15) having a comparator output connected with the output of the frequency regulator and first and second comparator inputs connected with said first and third memory outputs respectively; and program-controlled means for operating said microprocessor including means for operating said A/D converter to generate a digital input signal characteristic of a volume-determining state of said potentiometer and for storing said digital input signal in said first memory (10);

means for transferring contents of said first memory (10) including said digital input signal into said second memory (12) when said at least one switch (7) is actuated to switch off said power supply means (8);

means for transferring said contents of said first memory (10) into said third memory (14) when said at least one switch (7) is actuated to switch on said power supply means (8); and means for operating said change-over switch (18) according to a control signal from said comparator stage (15);

whereby said second input (19) of said change-over switch (18) is connected with said change-over switch output (17) when said contents of said first memory coincide with those of said third memory and said first input (18) of said change-over switch (18) is connected with said change-over switch output (17) when said contents of said first and said third memory no longer coincide.

3. The radio receiver as defined in claim 2, wherein the final amplifier stage (1) is connected with the audio frequency regulator (3), and further comprising means for continuously adjusting said final amplifier stage (1) until the volume corresponding to said contents of said first memory (10) is reached when the change-over switch output (17) is connected with said first change-over switch input (18).

4. The radio receiver as defined in claim 3, further comprising means for adjusting said final amplifier stage (1) to change the volume slower in a comparatively high volume range than in a comparatively low volume range.

5. The radio receiver as defined in claim 2, further comprising a digital low-pass filter (21) connected between the change-over switch output (17) and the regulator input of the audio frequency regulator (3).

6. The radio receiver as defined in claim 5, further comprising means for controlling said low-pass filter (21) according to a set value of the volume.

* * * * *